（12）United States Patent
Mori et al.

(10) Patent No.: US 8,535,856 B2
(45) Date of Patent: *Sep. 17, 2013

(54) LITHOGRAPHIC MASK AND MANUFACTURING METHOD THEREOF

(75) Inventors: Junji Mori, Kanagawa (JP); Katsuhiro Takushima, Tokyo (JP)

(73) Assignee: Hoya Corporation, Tokyo (JP)

( * ) Notice: Subject to any disclaimer, the term of this patent is extended or adjusted under 35 U.S.C. 154(b) by 30 days.

This patent is subject to a terminal disclaimer.

(21) Appl. No.: 13/402,363

(22) Filed: Feb. 22, 2012

(65) Prior Publication Data

US 2012/0156597 A1    Jun. 21, 2012

Related U.S. Application Data

(62) Division of application No. 12/511,415, filed on Jul. 29, 2009, now Pat. No. 8,263,294, and a division of application No. 11/165,536, filed on Jun. 24, 2005, now Pat. No. 7,585,418.

(30) Foreign Application Priority Data

Jun. 25, 2004    (JP) .................................. 2004-188157

(51) Int. Cl.
  *G03F 1/68*    (2012.01)
  *G03F 1/82*    (2012.01)

(52) U.S. Cl.
  USPC ............................................................ 430/5

(58) Field of Classification Search
  USPC ......... 430/5, 322, 323, 324; 378/35; 216/12, 216/54
  See application file for complete search history.

(56) References Cited

U.S. PATENT DOCUMENTS

| 6,277,205 B1 | 8/2001 | Nagamura et al. |
| 7,390,596 B2 | 6/2008 | Ishibashi et al. |
| 2002/0058186 A1 | 5/2002 | Nozawa et al. |
| 2002/0119378 A1 | 8/2002 | Angelopoulos et al. |
| 2005/0250018 A1 | 11/2005 | Ushida et al. |

FOREIGN PATENT DOCUMENTS

| JP | 2966369 | 8/1999 |
| KR | 10-2005-0058032 | 6/2005 |
| KR | 10-2005-0063340 | 6/2005 |
| WO | WO 2004/059384 | 7/2004 |

*Primary Examiner* — Stephen Rosasco
(74) *Attorney, Agent, or Firm* — Sughrue Mion, PLLC

(57) ABSTRACT

Cleaning is carried out by using a sulfuric acid type detergent at a resist stripping and cleaning step (step 5) in a semitranslucent portion forming process and a resist stripping and cleaning step (step 10) in a shielding band forming process, and a sulfuric acid removing step of partially or wholly removing a surface layer portion in a pattern into which a sulfate ion is adsorbed is then carried out to effectively remove the adsorbed sulfate ion.

25 Claims, 5 Drawing Sheets

STEP 9

STEP 10

EXCIMER UV
($\lambda$ = 172nm)

STEP 9

STEP 10

LITHOGRAPHIC MASK AND MANUFACTURING METHOD THEREOF

This application is a divisional of application Ser. No. 12/511,415, filed Jul. 29, 2009 which is a divisional of application Ser. No. 11/165,536, filed Jun. 24, 2005, which claims foreign priority based on Japanese Patent application No. 2004-188157, filed Jun. 25, 2004, the contents of which is incorporated herein by reference in its entirety.

BACKGROUND OF THE INVENTION

1. Field of the Invention

The present invention relates to a method of manufacturing a lithographic mask such as a photomask to be used for manufacturing a semiconductor device and the lithographic mask, and to a method of manufacturing a lithographic mask to be used in an exposing device utilizing such high power exposing means as to promote the forming reaction of an ammonium sulfate type foreign matter, for example, an exposed light constituted by a laser beam having a wavelength of 200 nm or less such as an ArF excimer laser beam, and the lithographic mask.

2. Description of the Related Art

In the formation of a transfer pattern in the manufacture of a semiconductor device, for example, an exposed light is irradiated on a resist through a photomask (reticle), for example. In such a case, there has conventionally been used a photomask in which a shielding film pattern is formed on a transparent substrate. For the material of a shielding film, generally, a chromium type material (a chromium simple substance, chromium containing nitrogen, oxygen and carbon, or a laminated film formed by these material films) is used. In recent years, furthermore, a phase shift mask has been used practically in order to enhance the resolution of the transfer pattern.

Phase shift masks of various types have been known (an alternative type, an auxiliary pattern type and a self-alignment type). For one of them, there has been known a halftone type phase shift mask which is suitable for the high resolution pattern transfer of a hole and a dot. In the halftone type phase shift mask, a semitranslucent film pattern having a phase shift amount of approximately 180 degrees is formed on a transparent substrate, and the semitranslucent film is formed as a single layer or a multilayer.

For example, JP No. 2966369 disclosed a semitranslucent film pattern which is constituted by a thin film formed by a substance containing, as a main component, a metal such as molybdenum, silicon and nitrogen. The semitranslucent film constituted by the materials is formed by a single layer and can control a predetermined phase shift amount and transmittance, and furthermore, is excellent in an acid resistance and a light resistance.

As described above, there has been considerably developed the film material to be used in the photomask which contains nitrogen in the film for various reasons.

When a pattern transfer is to be carried out by using the photomask (reticle), a laser beam is irradiated on the photomask. For this reason, there is a problem in that the formation of some deposit is promoted by a laser irradiation and the deposit becomes a foreign matter to stick onto the photomask. It has been confirmed that one of the deposits is ammonium sulfate.

For the photomask, generally, cleaning (including a resist stripping treatment and a treatment for removing a pellicle adhesive) using a liquid detergent containing S (sulfur) such as sulfuric acid (which will be hereinafter referred to as a sulfuric acid type detergent) is carried out for the resist stripping, the cleaning and the removal of the pellicle adhesive. However, it has been found that a sulfuric acid component derived from the sulfuric acid type detergent used at the cleaning step described above is adsorbed into a photomask surface and is removed with difficulty, and therefore, the sulfuric acid component remains in the photomask after the cleaning. It has been confirmed that these residues are different from each other depending on a pellicle or an environment for use and chemically react to an ammonia component in the air to form and deposit ammonium sulfate in the state of a crystal. Moreover, there was inspected a material containing nitrogen which is used for a thin film to be utilized in the photomask. As a result, it has been found that more ammonium ions ($NH_4^+$) are present on the surface of a thin film containing nitrogen than a thin film which does not contain the nitrogen. Accordingly, it can also be supposed that the nitrogen component in the thin film to be used in the photomask might contribute to the deposition of the ammonium sulfate which can be a foreign matter defect.

With the microfabriation of an LSI pattern in recent years, particularly, the wavelength of an exposed light source (the wavelength of an exposed light) has increasingly been reduced from an existing KrF excimer laser (248 nm) to an ArF excimer laser (193 nm) and an $F_2$ excimer laser (157 nm). In such a situation, for example, in the case in which an exposed light source having a short wavelength such as the ArF excimer laser is used, a laser output becomes high. Therefore, there is a problem in that the formation of a deposit can be promoted more easily and a foreign matter is generated more remarkably, resulting in a great influence on quality.

In the case in which the deposition of the ammonium sulfate is recognized on the surface of the photomask, a quality abnormality is caused so that it is necessary to carry out cleaning or fabrication again.

SUMMARY OF THE INVENTION

In consideration of the circumstances, it is an object of the invention to provide a method of manufacturing a lithographic mask which can suppress the amount of a sulfuric acid component remaining on the lithographic mask which causes the deposition of ammonium sulfate and/or can suppress the generation of the ammonium component of the lithographic mask which causes the deposition of the ammonium sulfate, thereby controlling the deposition of the ammonium sulfate when exposing a light from such high power exposing means as to promote the forming reaction of a foreign matter constituted by the ammonium sulfate, for example, an ArF excimer laser.

Furthermore, it is an object of the invention to provide a lithographic mask capable of suppressing the generation of the ammonia component of the lithographic mask which causes the deposition of ammonium sulfate, thereby controlling the deposition of the ammonium sulfate when exposing a light from such high power exposing means as to promote the forming reaction of a foreign matter constituted by the ammonium sulfate, for example, an ArF excimer laser.

In order to solve the problems, first means is directed to a method of manufacturing a lithographic mask including a desirable pattern on a substrate which is to be used in an exposing device utilizing such high power exposing means as to promote a forming reaction of an ammonium sulfate type foreign matter, comprising:

at least a step of forming the pattern, a cleaning step of carrying out cleaning using a sulfuric acid type detergent after the step of forming the pattern, and a sulfuric acid removing step of partially or wholly removing a surface layer portion of the pattern into which a sulfate ion is adsorbed after the cleaning step.

Second means is directed to the method of manufacturing a lithographic mask according to the first means, wherein the surface layer portion into which the sulfate ion is adsorbed is a sulfate ion adsorbing layer provided on a substrate or thin film for forming a pattern or the pattern before the cleaning step and before or after the step of forming the pattern.

Third means is directed to a method of manufacturing a lithographic mask including a desirable pattern on a substrate which is to be used in an exposing device utilizing such high power exposing means as to promote a forming reaction of an ammonium sulfate type foreign matter, comprising:

at least a step of forming the pattern, a cleaning step of carrying out cleaning using a sulfuric acid type detergent after the step of forming the pattern, and a sulfuric acid removing step using a non-sulfuric acid type liquid at a temperature of 85° C. or more after the cleaning step.

Fourth means is directed to the method of manufacturing a lithographic mask according to any of the first to third means, wherein the pattern has a layer constituted by a material containing at least nitrogen on at least an uppermost layer, the method further comprising a step of carrying out an ammonium ion formation preventing treatment for the layer constituted by a material containing at least nitrogen before or after forming the pattern.

Fifth means is directed to the method of manufacturing a lithographic mask according to the fourth means, wherein the ammonium ion formation preventing treatment is obtained by combining at least one of a heat treatment, a light irradiation treatment and a surface oxidation treatment.

Sixth means is directed to the method of manufacturing a lithographic mask according to the fourth or fifth means, wherein the cleaning step is executed after the step of carrying out the ammonium ion formation preventing treatment.

Seventh means is directed to a method of manufacturing a lithographic mask including a pattern having, on at least an uppermost layer, a layer constituted by a material containing at least silicon and nitrogen on a transparent substrate which is to be used in an exposing device utilizing such high power exposing means as to promote a forming reaction of an ammonium sulfate type foreign matter, comprising at least the steps of:

forming the pattern of the layer constituted by the material containing at least silicon and nitrogen; and carrying out an ammonium ion formation preventing treatment over the layer constituted by the material containing at least silicon and nitrogen on which the pattern is formed.

Eighth means is directed to the method of manufacturing a lithographic mask according to the seventh means, wherein the ammonium ion formation preventing treatment is obtained by combining at least one of a heat treatment, a light irradiation treatment and an oxidation treatment.

Ninth means is directed to the method of manufacturing a lithographic mask according to the seventh or eighth means, wherein the ammonium ion formation preventing treatment is carried out at a final step for the lithographic mask.

Tenth means is directed to the method of manufacturing a lithographic mask according to any of the first to ninth means, wherein the lithographic mask is a photomask to be used in an exposing device having an exposed light in a wavelength of 200 nm or less.

Eleventh means is directed to the method of manufacturing a lithographic mask according to the tenth means, wherein the lithographic mask is a phase shift mask to be used in an exposing device including an ArF excimer laser as an exposed light source, and the pattern has, on at least an uppermost layer, a semitranslucent film containing molybdenum, silicon and nitrogen.

Twelfth means is directed to a lithographic mask to be a photomask including a pattern having, on at least an uppermost layer, a layer constituted by a material containing at least nitrogen on a transparent substrate which is to be used in an exposing device utilizing such high power exposing means as to promote a forming reaction of a foreign matter constituted by ammonium sulfate, wherein the layer constituted by the material containing at least nitrogen is subjected to surface reforming by an ammonium ion formation preventing treatment carried out after forming the pattern.

Thirteenth means is directed to the lithographic mask according to the twelfth means, wherein the lithographic mask is a photomask to be used in an exposing device having an exposed light in a wavelength of 200 nm or less.

Fourteenth means is directed to the lithographic mask according to the thirteenth means, wherein the lithographic mask is a phase shift mask to be used in an exposing device including an ArF excimer laser as an exposed light source, and the pattern has, on at least an uppermost layer, a semitranslucent film containing molybdenum, silicon and nitrogen.

According to the method of manufacturing a lithographic mask in accordance with the invention, it is possible to suppress the amount of a sulfuric acid component remaining on the lithographic mask which causes the deposition of ammonium sulfate and/or to suppress the generation of the ammonia component of the lithographic mask which causes the deposition of the ammonium sulfate, thereby controlling the deposition of the ammonium sulfate when exposing a light from such high power exposing means as to promote the forming reaction of a foreign matter constituted by the ammonium sulfate, for example, an ArF excimer laser.

According to the lithographic mask in accordance with the invention, furthermore, it is possible to suppress the generation of the ammonia component of the lithographic mask which causes the deposition of ammonium sulfate, thereby controlling the deposition of the ammonium sulfate when exposing a light from such high power exposing means as to promote the forming reaction of a foreign matter constituted by the ammonium sulfate, for example, an ArF excimer laser.

DESCRIPTION OF THE PREFERRED EMBODIMENTS

Figure 1:
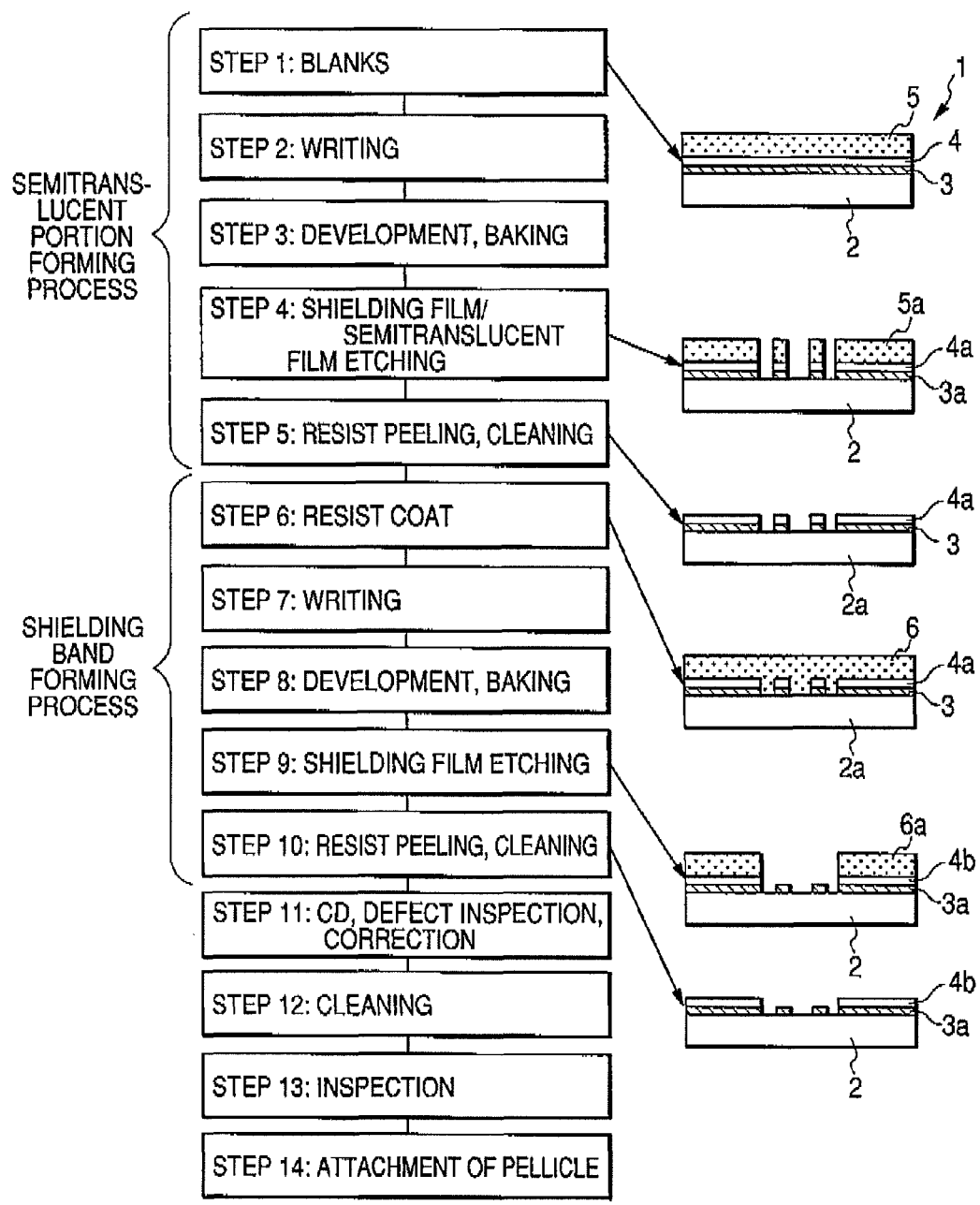
FIG. 1 is a view showing an example of the flow of a method of manufacturing a halftone type phase shift mask.

Embodiments of the present invention will be described hereinbelow by reference to the drawings. Unless otherwise specifically defined in the specification, terms have their ordinary meaning as would be understood by those of ordinary skill in the art.

For example, in order to reduce the deposition of an ammonium sulfate type foreign matter (including ammonium sulfate and an ammonia salt mainly containing the ammonium sulfate) when exposing a light from such high power exposing means as to promote the forming reaction of the ammonium sulfate type foreign matter, for example, an exposed light constituted by a laser beam having a wavelength of 200 nm or less such as an ArF excimer laser beam, it is possible to propose a method of reducing a sulfate ion on a lithographic mask and a method of reducing an ammonium ion.

First of all, a method of reducing a sulfate ion remaining in a sulfuric acid type detergent to be used at a cleaning step can be taken as the method of reducing a sulfate ion.

A method of manufacturing a lithographic mask according to a first embodiment of the invention is one of the methods of reducing a sulfate ion remaining in a sulfuric acid type detergent to be used at the cleaning step, and has at least a sulfuric acid removing step of partially or wholly removing a surface layer portion in a pattern into which the sulfate ion is adsorbed after the cleaning step of carrying out cleaning by using the sulfuric acid type detergent.

More specifically, it is possible to reduce the residual sulfuric acid by partially or wholly removing the surface layer portions of the surface and side wall of the pattern into which the sulfate ion is adsorbed.

At the sulfuric acid removing step, examples of the method of partially removing the surface layer portion of the pattern include a method of carrying out slight etching by using a liquid in which the material of the surface layer portion can be dissolved and a method of sliding a substance capable of physically removing the surface layer portion in contact such as a scrubbing method. In order to effectively remove the adsorbed sulfate ion, it is preferable that a depth for the removal should be set to be equal to or greater than 10 Å.

For example, in case of a semitranslucent phase shift layer containing molybdenum, silicon and nitrogen in a halftone type phase shift mask, it is possible to remove the surface layer portion by dipping into a non-sulfuric acid type liquid (a liquid containing no S (sulfur)) such as pure water at 85° C. or more, the supply of the non-sulfuric acid type liquid such as the supply of a puddle through a spin method or an exposure to a mist-like non-sulfuric acid type liquid. This treatment is executed as a rinse step after the cleaning, and furthermore, as a separate step from the rinse step. The sulfuric acid removing step is carried out as the rinse step after sulfuric acid cleaning, and furthermore, the sulfuric acid removing step is carried out as another step. Consequently, it is possible to shorten a time required for a treatment at the sulfuric acid removing step. At a separate step from the rinse, the treatment may be carried out successively after the rinse or after the execution of another cleaning treatment. The temperature of the liquid is preferably set to be equal to or higher than 85° C. in order to effectively remove the sulfate ion and is more preferably set to be equal to or higher than 90° C. because the effect of removing the sulfate ion is rapidly enhanced.

Examples of the removal of the surface layer portion include dipping into an alkaline solution or a fluoric acid solution, the supply of a liquid and an exposure to a mist-like liquid.

In order to carry out the sulfuric acid removing step and to prevent an original pattern characteristic from being damaged, it is possible to propose a method of forming a pattern which anticipates a portion to be removed.

In a method of manufacturing a lithographic mask according to a second embodiment of the invention, the surface layer portion into which the sulfate ion is adsorbed is set to be a sulfate ion adsorbing layer formed on a substrate or thin film for forming a pattern or on the pattern before the cleaning step and before or after the step of forming the pattern, and there will be disclosed another example of the method of carrying out a sulfuric acid removing step and preventing an original pattern characteristic from being damaged in the method of manufacturing a lithographic mask according to the first embodiment.

Examples of the method include a method of providing a new layer as a sulfate ion adsorbing layer in a blank state before the formation of a pattern before a cleaning step or after the formation of a pattern before the cleaning step and a method in which an upper layer serves as the sulfate ion adsorbing layer in a film having a multilayer structure and the cleaning step is carried out in a state in which the upper layer is present and the upper layer is then removed.

Furthermore, the sulfate ion adsorbing layer in this method includes a layer formed by carrying out surface finishing over the surface layer portion in the method of manufacturing a lithographic mask according to the first embodiment, and the sulfuric acid removing step includes the partial or whole removal of the surface finishing layer in the direction of a depth or the removal of the surface finishing layer and a lower portion. Examples of the surface finishing include a treatment for oxidizing a surface layer portion (a heat treatment, a light irradiation and ashing). By changing a composition through the surface finishing, it is also possible to control an etching speed in the removal of the surface layer portion, thereby controlling the amount of the removal.

In a method of manufacturing a lithographic mask according to a third embodiment of the invention, a method having at least a sulfuric acid removing step using a non-sulfuric acid type liquid at a temperature of 85° C. or more after a cleaning step of carrying out cleaning using a sulfuric acid type detergent is employed as another method of reducing a sulfate ion remaining in the sulfuric acid type detergent to be used at the cleaning step.

According to this method, it is possible to effectively remove the residual sulfate ion adsorbed into the lithographic mask.

This treatment may be carried out as both the rinse step after the cleaning and a separate step from the rinse step. By executing the sulfuric acid removing step as the rinse step after the sulfuric acid cleaning, and furthermore, the sulfuric acid removing step as another step, it is possible to shorten a time required for processing the sulfuric acid removing step. In the case in which the treatment is to be carried out as the separate step from the rinse, it may be executed successively after the rinse or after the execution of another cleaning. Moreover, the sulfuric acid removing step according to the embodiment also includes the case in which the surface layer portion of a pattern is not removed. It is preferable that the temperature of a liquid should be set to be equal to or higher than 90° C. because the effect of removing a sulfate ion is rapidly enhanced.

Moreover, the sulfuric acid removing step can be carried out by dipping into a non-sulfuric acid type liquid, the supply of the non-sulfuric acid type liquid such as the supply of a puddle through a spin method, or an exposure to a mist-like non-sulfuric acid type liquid.

Next, a method of manufacturing a lithographic mask according to a fourth embodiment serves to reduce the presence of an ammonium ion in addition to the sulfuric acid removing step, and has a step of carrying out an ammonium ion formation preventing treatment over the layer constituted by a material containing at least nitrogen before or after the formation of a pattern.

As the method of reducing an ammonium ion, it is possible to propose a method of suppressing the generation of the ammonium ion from a thin film containing nitrogen. According to the embodiment, however, it is possible to suppress the ammonium ion generated from the thin film containing nitrogen.

Referring to the ammonium ion format ion preventing treatment, the concentration of an ammonium ion ($NH_4^+$) is more decreased than that before the treatment when the concentration of the $NH_4^+$ is measured by ion chromatography through a pure water extraction over a surface subjected to the treatment. This treatment is carried out in such a manner that the concentration of the $NH_4^+$ measured by the ion chromatography is equal to or lower than 20 $ng/cm^2$, is preferably equal to or lower than 10 $ng/cm^2$, and is further preferably equal to or lower than 5 $ng/cm^2$, for example.

The ammonium ion format ion preventing treatment may be carried out in a blank state before the formation of a pattern or after the formation of the pattern (after an etching step). By executing the treatment after the formation of the pattern, it is possible to carry out surface finishing over the side wall of the pattern, which is preferable.

Examples of the thin film containing nitrogen in a lithographic mask include a shielding film in a photomask, a reflection preventing film and a semitranslucent film in a halftone type phase shift mask. The semitranslucent film in the halftone type phase shift mask has a single layer structure and a multilayer structure, and examples of the material of the semitranslucent film having the single layer structure include a material containing silicon and nitrogen, a material containing a metal, silicon and nitrogen, or a material containing at least one selected from oxygen, fluorine, carbon and hydrogen therein. The metal contains at least one selected from molybdenum, tantalum, tungsten, chromium, titanium, nickel, palladium, hafnium and zirconium, and the semitranslucent film having the multilayer structure includes a film formed by at least two material films of the semitranslucent film having the single layer structure, a transmittance regulating layer such as a metal film containing at least one selected from chromium, tantalum, hafnium, magnesium, aluminum, titanium, vanadium, yttrium, zirconium, niobium, molybdenum, tin, lanthanum, tungsten and silicon, and a film formed by laminating the material of the single layer (a halftone film). The semitranslucent film has a phase difference set to be approximately 180 degrees and a transmittance selected from a range of 3 to 40% in order to obtain a phase shift effect.

Since it can be supposed that the ammonium ion formation preventing treatment has a treating efficiency reduced by the influence of the sulfate ion adsorbed at the cleaning step, it is preferable that the same treatment should be carried out before the cleaning step using the sulfuric acid type detergent or after the sulfuric acid removing step if it is to be executed after the cleaning step. In some cases, moreover, a cleaning resistance or warm water resistance of a pattern is enhanced as a result of the stabilization of the surface layer portion by the ammonium ion formation preventing treatment. In a pattern formed by a material containing molybdenum, silicon and nitrogen to be used in a halftone type phase shift mask, for example, in some cases in which the sulfuric acid removing step using the warm water (for example, 85° C. or more) is carried out, the warm water resistance is insufficient so that an optical characteristic is changed. Thus, there is a possibility that the characteristic of the pattern might be changed at the sulfuric acid removing step. In the case in which the change in the characteristic can be reduced by the ammonium ion formation preventing treatment, it is preferable that the ammonium ion formation preventing treatment should be carried out before the sulfuric acid removing step. Furthermore, the ammonium ion formation preventing treatment may be carried out plural times.

In a method of manufacturing a lithographic mask according to a fifth embodiment, the ammonium ion formation preventing treatment is combined with at least one of a heat treatment, a light irradiation treatment and a surface oxidation treatment.

Examples of the heat treatment include a surface thermal oxidation treatment in the air or an oxygen or carbon dioxide atmosphere containing the oxygen, or a heat treatment in an inert gas atmosphere such as nitrogen or argon or in vacuum. It can be supposed that the formation of an ammonium ion is suppressed by the promotion and stabilization of the rearrangement of a film structure through the heat treatment. A heat treatment temperature is equal to or higher than 180° C. and is preferably equal to or higher than 250° C. Moreover, a time required for the heat treatment is varied depending on the treatment temperature and the treatment atmosphere, and is equal to or longer than 5 minutes at a minimum and is preferably equal to or longer than 10 minutes in consideration of the uniform application of a heat. In some cases in which the heat treatment temperature exceeds 400° C., a reaction to the surface of a thin film sensitively progresses in an active atmosphere containing oxygen, for example, and there is a possibility that the function of the thin film might be damaged. For this reason, it is preferable that the heat treatment should be carried out in an atmosphere in which oxygen is not contained or the concentration of the oxygen is sufficiently controlled.

A light irradiation can be executed by using a light having a wavelength of 200 nm or less, for example, an excimer UV irradiating device having a wavelength of 172 nm which is used as an irradiating light source in cleaning. The light irradiation can be treated in the air or in an oxygen or carbon dioxide atmosphere containing the oxygen. An irradiating output is equal to or higher than 10 mW and is preferably equal to or higher than 30 mW, and a time required for an irradiation is equal to or longer than 5 minutes and is preferably equal to or longer than 10 minutes.

Examples of the surface oxidation treatment include ashing, ion implantation and ozone oxidation in the oxygen atmosphere in addition to the thermal oxidation treatment and the photooxidation treatment. By increasing the content of the oxygen on the surface through the surface oxidation treatment, it is possible to suppress the formation of an ammonium ion.

In a method of manufacturing a lithographic mask according to a sixth embodiment, the cleaning step in the method according to the fourth or fifth embodiment is carried out after the step of executing the ammonium ion formation preventing treatment.

According to this method, the ammonium ion formation preventing treatment is carried out before a contact with a liquid such as a sulfuric acid type cleaning solution to be used at the cleaning step. Therefore, the ammonium ion formation preventing treatment has a high treating efficiency. Furthermore, there is a possibility that the characteristic of a pattern might be changed at the cleaning step or a sulfuric acid removing step. In the case in which the change in the characteristic can be reduced by the ammonium ion formation preventing treatment, the cleaning step is carried out after the ammonium ion formation preventing treatment so that the change in the characteristic of the pattern can be suppressed.

A method of manufacturing a lithographic mask according to a seventh embodiment serves to reduce the presence of an ammonium ion and to manufacture a lithographic mask including a pattern having, on at least an uppermost layer, a layer constituted by a material containing at least silicon and nitrogen on a transparent substrate which is to be used in an exposing device utilizing such high power exposing means as to promote a forming reaction of a foreign matter constituted by ammonium sulfate, comprising at least the steps of forming the pattern of the layer constituted by the material containing at least silicon and nitrogen, and carrying out an ammonium ion formation preventing treatment over the layer constituted by the material containing at least silicon and nitrogen on which the pattern is formed.

As the method of reducing an ammonium ion, it is possible to propose a method of suppressing the ammonium ion generated from a thin film containing nitrogen. According to the method of manufacturing a lithographic mask in accordance with the seventh embodiment, however, it is possible to suppress the ammonium ion generated from the thin film containing nitrogen.

Referring to the ammonium ion format ion preventing treatment, the concentration of an ammonium ion ($NH_4^+$) is more decreased than that before the treatment when the concentration of the $NH_4^+$ is measured by ion chromatography through a pure water extraction over a surface subjected to the treatment. This treatment is carried out in such a manner that the concentration of the $NH_4^+$ measured by the ion chromatography is equal to or lower than 20 $ng/cm^2$, is preferably equal to or lower than 10 $ng/cm^2$, and is further preferably equal to or lower than 5 $ng/cm^2$, for example.

By carrying out the ammonium ion formation preventing treatment after the formation of a pattern (after an etching step), it is possible to execute surface finishing over the side wall of the pattern.

Examples of the thin film containing nitrogen in a lithographic mask include a shielding film in a photomask, a reflection preventing film and a semitranslucent film in a phase shift mask. The semitranslucent film in a halftone type phase shift mask has a single layer structure and a multilayer structure, and examples of the material of the semitranslucent film having the single layer structure include a material containing silicon and nitrogen, a material containing a metal, silicon and nitrogen, or a material containing at least one selected from oxygen, fluorine, carbon and hydrogen therein. The metal contains at least one selected from molybdenum, tantalum, tungsten, chromium, titanium, nickel, palladium, hafnium and zirconium, and the semitranslucent film having the multilayer structure includes a film formed by laminating at least two material films of the semitranslucent film having the single layer structure, a transmittance regulating layer such as a metal film containing at least one selected from chromium, tantalum, hafnium, magnesium, aluminum, titanium, vanadium, yttrium, zirconium, niobium, molybdenum, tin, lanthanum, tungsten and silicon, and a film formed by laminating the material of the single layer (a halftone film). The semitranslucent film of the halftone type phase shift mask has a phase difference set to be approximately 180 degrees and a transmittance selected from a range of 3 to 40% in order to obtain a phase shift effect. Furthermore, examples of a phase shift mask other than the halftone type phase shift mask includes a phase shift mask in which a semitranslucent film does not substantially have a phase shift function but said function is caused by trimming a substrate. In this case, it is possible to propose a semitranslucent film which has the material of the single layer halftone type phase shift mask on at least an upper layer.

In the method of manufacturing a lithographic mask according to the seventh embodiment, moreover, in the case in which the cleaning using the sulfuric acid type cleaning solution is to be carried out, a processing of suppressing a residual sulfuric acid ion as much as possible is executed or only cleaning using a non-sulfuric acid type cleaning solution is performed to reduce the presence of a sulfate ion which is another cause of deposition of the ammonium sulfate. Consequently, it is possible to prevent the deposition of an ammonium sulfate type foreign matter more effectively.

In the ammonium ion formation preventing treatment, it can be supposed that a treating efficiency is reduced by the influence of the sulfate ion to be adsorbed at the cleaning step when the cleaning is to be carried out by using the sulfuric acid type detergent. Therefore, it is preferable that the treatment should be carried out before the cleaning step using the sulfuric acid type detergent or after the sulfuric acid removing step if it is to be executed after the cleaning step. In the case in which there is a possibility that the characteristic of the pattern might be changed at the cleaning step and the change in the characteristic can be reduced by the ammonium ion formation preventing treatment, moreover, it is preferable that the ammonium ion formation preventing treatment should be carried out before the same step. Furthermore, the ammonium ion formation preventing treatment may be carried out plural times.

In a method of manufacturing a lithographic mask according to an eighth embodiment, the ammonium ion formation preventing treatment in the method of manufacturing a lithographic mask according to the seventh embodiment is combined with at least one of a heat treatment, a light irradiation treatment and a surface oxidation treatment.

Examples of the heat treatment include a surface thermal oxidation treatment in the air or an oxygen or carbon dioxide atmosphere containing the oxygen, or a heat treatment in an inert gas atmosphere such as nitrogen or argon or in vacuum. It can be supposed that the formation of an ammonium ion is suppressed by the promotion and stabilization of the rearrangement of a film structure through the heat treatment. A heat treatment temperature is equal to or higher than 180° C. and is preferably equal to or higher than 250° C. Moreover, a time required for the heat treatment is varied depending on the treatment temperature and the treatment atmosphere, and is equal to or longer than 5 minutes at a minimum and is preferably equal to or longer than 10 minutes in consideration of the uniform application of a heat. In some cases in which the heat treatment temperature exceeds 400° C., a reaction to the surface of a thin film sensitively progresses in an active atmosphere containing oxygen, for example, and there is a possibility that the function of the thin film might be damaged. For this reason, it is preferable that the heat treatment should be carried out in an atmosphere in which oxygen is not contained or the concentration of the oxygen is sufficiently controlled.

A light irradiation can be executed by using a light having a wavelength of 200 nm or less, for example, an excimer UV irradiating device having a wavelength of 172 nm which is used as an irradiating light source in cleaning. The light irradiation can be treated in the air or in an oxygen or carbon dioxide atmosphere containing the oxygen. An irradiating output is equal to or higher than 10 mW and is preferably equal to or higher than 30 mW, and a time required for an irradiation is equal to or longer than 5 minutes and is preferably equal to or longer than 10 minutes.

Examples of the surface oxidation treatment include ashing, ion implantation and ozone oxidation in the oxygen atmosphere in addition to the thermal oxidation treatment and the photooxidation treatment. By increasing the content of the oxygen on the surface through the surface oxidation treatment, it is possible to suppress the formation of an ammonium ion.

In a method of manufacturing a lithographic mask according to a ninth embodiment, the ammonium ion formation preventing treatment in the method of manufacturing a lithographic mask according to the seventh or eighth embodiment is carried out at the final step of the lithographic mask. More specifically, the resistance of the ammonia formation preventing treatment is exceeded through cleaning using the sulfuric acid type detergent, a rinse using warm pure water and other treating steps after the execution of the ammonia formation preventing treatment in some cases. In consideration of that respect, in case of a photomask, for example, the ammonia format ion preventing treatment is carried out at a final step before the attachment of a pellicle. In the use of the mask, consequently, it is possible to prevent the deposition of the ammonium sulfate type foreign matter in use for an exposing device utilizing such high power exposing means as to promote the forming reaction of the ammonium sulfate type foreign matter. The ammonia formation preventing treatment to be carried out herein may be a reprocessing for supplementing the effect of the ammonium ion formation preventing treatment executed in a process for manufacturing the mask.

In a method of manufacturing a lithographic mask according to a tenth embodiment, the method of manufacturing a lithographic mask according to each of the first to ninth embodiments is suitably used in order to manufacture a photomask to be used in an exposing device having an exposed light in a wavelength of 200 nm or less which includes an ArF excimer laser (193 nm) and an $F_2$ excimer laser (157 nm), for example. Consequently, it is possible to suppress the formation of a foreign matter constituted by ammonium sulfate which becomes a problem when the exposed light having a wavelength of 200 nm or less is irradiated.

In a method of manufacturing a lithographic mask according to an eleventh embodiment, the lithographic mask is a phase shift mask to be used in an exposing device comprising an ArF excimer laser as an exposing light source. Referring to the pattern, it is possible to suitably use the method of manufacturing a lithographic mask according to the tenth embodiment in order to manufacture a phase shift mask having a semitranslucent film containing molybdenum, silicon and nitrogen on at least an uppermost layer.

Examples of such a phase shift mask include a single layer halftone type phase shift mask comprising a semitranslucent layer to be a single layer, a multilayer halftone type phase shift mask comprising a semitranslucent layer having a multilayer phase shift function including a layer containing molybdenum, silicon and nitrogen on an upper layer, and a phase shift mask in which the semitranslucent layer does not substantially have the phase shift function and is caused to have the phase shift function by trimming a substrate.

A lithographic mask according to a twelfth embodiment can reduce the presence of an ammonium ion and a lithographic mask according to a thirteenth embodiment is a photomask including a pattern having, on at least an uppermost layer, a layer constituted by a material containing at least nitrogen on a transparent substrate which is to be used in an exposing device utilizing such high power exposing means as to promote a forming reaction of a foreign matter constituted by ammonium sulfate, and the layer constituted by the material containing at least nitrogen is subjected to surface reforming by an ammonium ion formation preventing treatment carried out after forming the pattern.

Referring to the ammonium ion format ion preventing treatment, the concentration of an ammonium ion ($NH_4^+$) is more decreased than that before the treatment when the concentration of the $NH_4^+$ is measured by ion chromatography through a pure water extraction over a surface subjected to the treatment. This treatment is carried out in such a manner that the concentration of the $NH_4^+$ measured by the ion chromatography is equal to or lower than 20 ng/cm$^2$, is preferably equal to or lower than 10 ng/cm$^2$, and is further preferably equal to or lower than 5 ng/cm$^2$, for example.

More specifically, the surface reforming gives a surface layer in which a composition is changed or the quality of a film is deteriorated through at least one of a heat treatment, a light irradiation treatment and a surface oxidation treatment. It is preferable that a depth should be equal to or greater than 10 Å in order to obtain an ammonium ion formation preventing effect.

Examples of the thin film containing nitrogen in a lithographic mask include a shielding film in a photomask, a reflection preventing film and a semitranslucent film in a phase shift mask. The semitranslucent film in a halftone type phase shift mask has a single layer structure and a multilayer structure, and examples of the material of the semitranslucent film having the single layer structure include a material containing silicon and nitrogen, a material containing a metal, silicon and nitrogen, or a material containing at least one selected from oxygen, fluorine, carbon and hydrogen therein, for example. The metal contains at least one selected from molybdenum, tantalum, tungsten, chromium, titanium, nickel, palladium, hafnium and zirconium, and the semitranslucent film having the multilayer structure includes a film formed by laminating at least two material films of the semitranslucent film having the single layer structure, a transmittance regulating layer such as a metal film containing at least one selected from chromium, tantalum, hafnium, magnesium, aluminum, titanium, vanadium, yttrium, zirconium, niobium, molybdenum, tin, lanthanum, tungsten and silicon, and a film formed by laminating the material of the single layer (a halftone film). The semitranslucent film in the halftone type phase shift mask has a phase difference set to be approximately 180 degrees and a transmittance selected from a range of 3 to 40% in order to obtain a phase shift effect. Furthermore, examples of a phase shift mask other than the halftone type phase shift mask include a phase shift mask in which a semitranslucent film does not substantially have a phase shift function and is caused to have the phase shift function by trimming a substrate. In this case, it is possible to propose a semitranslucent film which has the material of the single layer halftone type phase shift mask on at least an upper layer.

According to a lithographic mask in accordance with the thirteenth embodiment, the lithographic mask according to the twelfth embodiment is suitably used as a photomask to be utilized in an exposing device having an exposed light in a wavelength of 200 nm or less which includes an ArF excimer laser (193 nm) and an $F_2$ excimer laser (157 nm), for example. Consequently, it is possible to suppress the formation of a foreign matter constituted by ammonium sulfate which becomes a problem when the exposed light having a wavelength of 200 nm or less is irradiated.

A lithographic mask according to a fourteenth embodiment is obtained by setting the lithographic mask according to the thirteenth embodiment to be a phase shift mask to be used in an exposing device comprising an ArF excimer laser as an exposed light source, and the pattern is set to have a semitranslucent film containing molybdenum, silicon and nitrogen on at least an uppermost layer. In order to manufacture the phase shift mask in the lithographic mask according to the embodiment, it is possible to suitably use the lithographic mask according to the thirteenth embodiment.

Examples of such a phase shift mask include a single layer halftone type phase shift mask comprising a semitranslucent layer to be a single layer, a multilayer halftone type phase shift mask comprising a semitranslucent layer having a multilayer phase shift function including a layer containing molybdenum, silicon and nitrogen on an upper layer, and a phase shift mask in which the semitranslucent layer does not substantially have the phase shift function and is caused to have the phase shift function by trimming a substrate.

The invention will be described below in more detail with reference to examples applied to the method of manufacturing a halftone type phase shift mask.

EXAMPLE 1

FIG. 1 shows an example of the flow of a method of manufacturing a halftone type phase shift mask to be a kind of a photomask.

First of all, there is prepared a photomask blank 1 in which a semitranslucent film 3 having a single layer structure constituted substantially by a metal such as molybdenum, silicon and nitrogen is formed on a transparent substrate 2, a chromium type shielding film 4 is formed thereon, and furthermore, a resist film 5 is formed thereon (FIG. 1 (step 1)). The semitranslucent film 3 is formed on the transparent substrate 2 by reactive sputtering (DC sputtering) in a mixed gas atmosphere of argon (Ar) and nitrogen ($N_2$) (Ar:$N_2$=10%:90%, pressure: 0.2 Pa) using a mixing target (Mo:Si=8:92 mol %) of molybdenum (Mo) and silicon (Si). The photomask blank 1 is used for an ArF excimer laser (a wavelength of 193 nm) having a transmittance of 5.5% and a phase shift amount of approximately 180 degrees.

Next, the resist film 5 is subjected to writing (FIG. 1 (step 2)), and a process treatment such as development and baking (FIG. 1 (step 3)) in order to form a pattern. Thus, a resist pattern 5a is formed. Next, the shielding film 4 is etched to form a shielding portion 4a through dry etching (FIG. 1 (step 4)) using a $CF_4+O_2$ gas, and subsequently, the semitranslucent film 3 is subjected to etching to form a semitranslucent portion 3a by using the resist pattern 5a and the shielding portion 4a as a mask and resist stripping and cleaning are carried out (FIG. 1 (step 5)) so that a semitranslucent portion is fabricated (the steps 1 to 5 will be referred to as a semitranslucent portion forming process).

Then, a resist film 6 is coated over the substrate in which the semitranslucent portion fabricating process has been completed (FIG. 1 (step 6)). Thereafter, the resist film 6 in a region in which the shielding portion 4a is unnecessary (the transfer region of a mask) is drawn (FIG. 1 (step 7)), and a process treatment such as development and baking (FIG. 1 (step 8)) is carried out to form a resist film pattern 6a so that the unnecessary portion of the shielding portion 4a is exposed. Furthermore, the shielding portion 4a exposed by the etching is subjected to the etching (FIG. 1 (step 9)), and resist stripping and cleaning (FIG. 1 (step 10)) are carried out to form a shielding band 4b in the peripheral portion of the transfer region of the mask (the steps 6 to 10 will be referred to as a shielding band forming process).

Thereafter, a CD measurement, a defect inspection and a correction of a pattern defect (FIG. 1 (step 11)) are carried out. In the case in which the quality of the photomask can be guaranteed by final cleaning (FIG. 1 (step 12)) and an inspection (FIG. 1 (step 13)), the attachment of a pellicle (FIG. 1 (step 14)) is executed.

Figure 2:
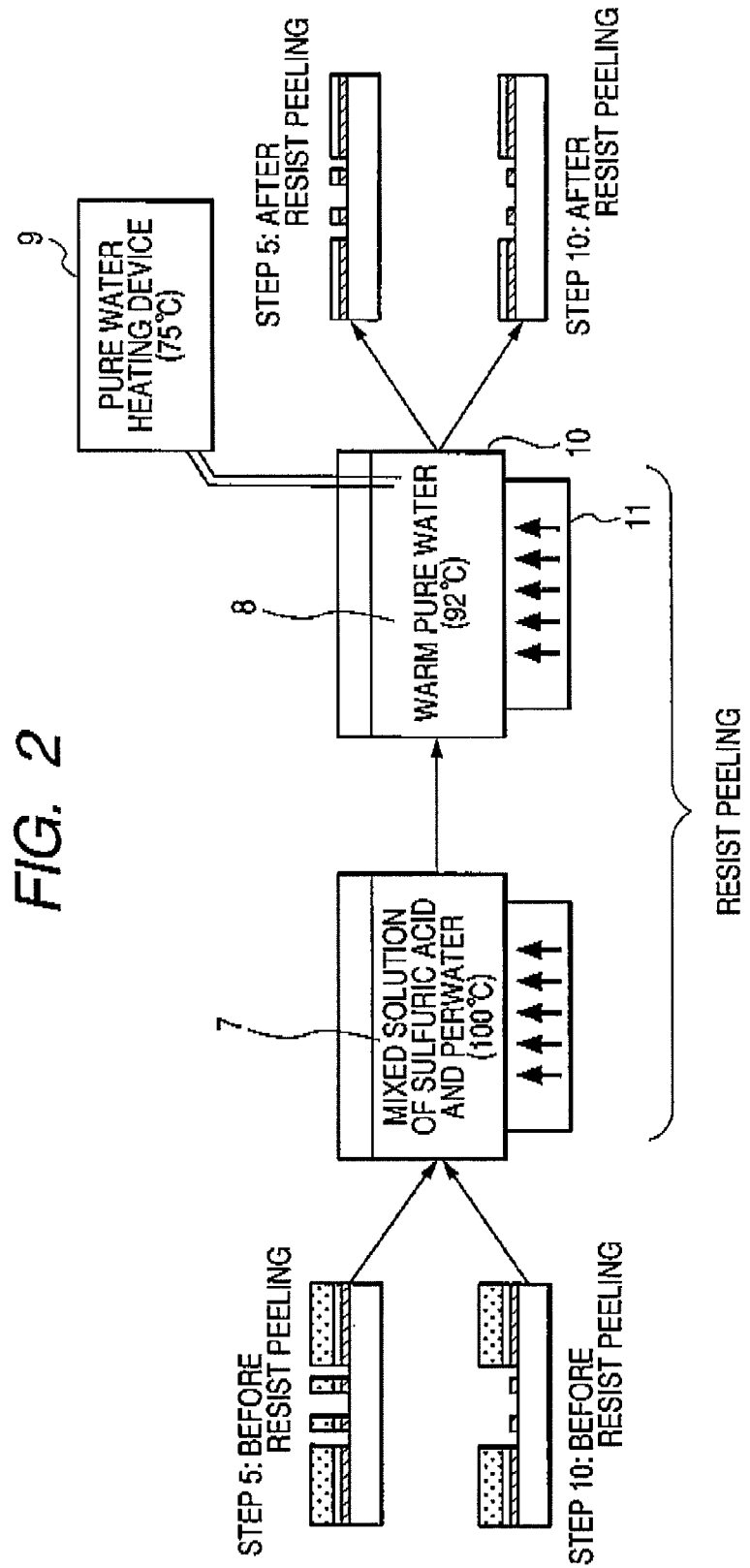
FIG. 2 is a view for explaining a sulfuric acid removing step according to an example 1.

In the example 1, a sulfuric acid removing step is executed. FIG. 2 is a view for explaining the sulfuric acid removing step according to the example 1.

In the example, a mixed solution 7 of sulfuric acid and perwater at 100° C. was used in the resist stripping carried out at the step 5 to be the resist stripping and cleaning step in the semitranslucent portion forming process and the step 10 to be the resist stripping and cleaning step in the shielding band forming process, and a warm pure water 8 at 92° C. was used in a subsequent rinse in the process described with reference to FIG. 1. The rinse step corresponds to the sulfuric acid removing step according to the invention. At the rinse step, a pure water heating device 9 for a semiconductor which has been put on the market has a limit of approximately 85° C. in respect of the safety of the device and a guarantee for performance. For this reason, warm pure water at 75° C. supplied from the pure water heating device was fed to a dipping vessel 10 formed of quartz and a heater 11 for raising a temperature was provided on the outside of the dipping vessel to raise the temperature of the pure water to 92° C.

After the step 10 was executed, the concentration of a sulfate ion on the surface of the mask was measured by ion chromatography. As a result, the concentration of the sulfate ion was 0.2 ng/$cm^2$ and a reduction in the concentration of the sulfate ion was found.

According to the example, therefore, it is possible to reduce a substance to be the origin of the depositing reaction of an ammonium sulfate type foreign matter through the irradiation of an exposed light by executing the sulfuric acid removing step. As a result, it is possible to reduce the deposition of the ammonium sulfate type foreign matter.

While the sulfuric acid removing step has been carried out at both of the steps 5 and 10 in the example, a part of the shielding portion 4a into which the sulfate ion is adsorbed at the step 5 is removed by the etching at the step 9. For this reason, the sulfuric acid removing step of the sulfate ion adsorbed at the step 5 may serve as the etching of the shielding portion 4a at the step 9 in place of the step 5.

COMPARATIVE EXAMPLE 1

For a comparison, the same treatment as that in the example was carried out except that a pure water rinse temperature in the example 1 was set to be 75° C. At that time, the concentration of the sulfate ion on the surface of the mask was 1.7 ng/$cm^2$ in a measuring method on the same condition as that in the example 1.

EXAMPLE 2

Figure 3:
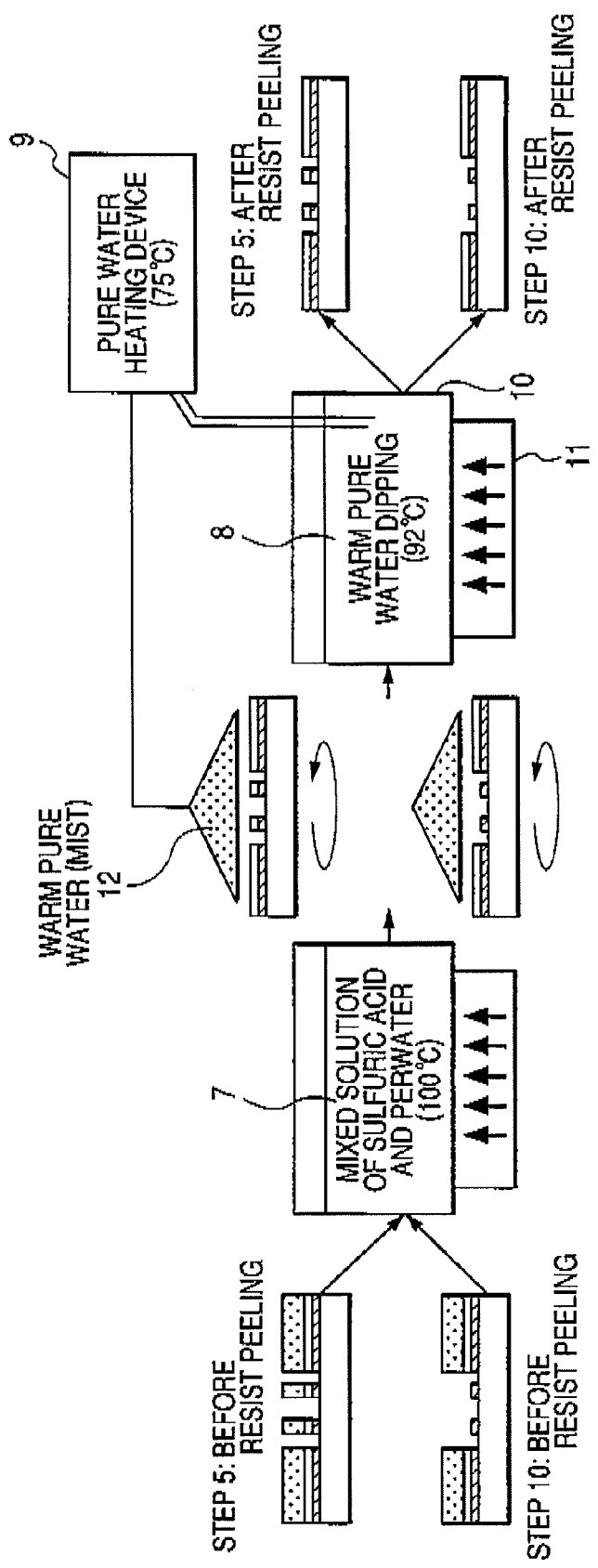
FIG. 3 is a view for explaining a sulfuric acid removing step according to an example 2.

An example 2 is another example of the execution of the sulfuric acid removing step and FIG. 3 is a view for explaining the sulfuric acid removing step according to the example 2.

In the example, at the rinse step using warm pure water at 92° C. in the example 1, a spin treatment is executed while discharging a warm pure water mist 12 at 75° C. and a dipping treatment at 92° C. is used as a next rinse step.

According to the example, the supply of the warm pure water of the pure water heating device 9 is limited by only the same dipping treatment as that in the example 1. For this reason, a liquid substitution efficiency in the warm pure water dipping vessel 10 is deteriorated and the sulfuric acid removing step (a time required for the treatment of the warm pure water) is prolonged. According to circumstances, a warm water resistance is not sufficient. Consequently, the optical characteristic of a semitranslucent film is changed. By setting a spinning method having a high substitution efficiency as a prerinse step to remove residual sulfuric acid in a short time, therefore, it is possible to shorten a time required for a dipping treatment at 92° C. to be a next rinse step. As a result, it is possible to suppress a fluctuation in the optical characteristic of a semitranslucent film. While the warm pure water at 75° C. has been used at the prerinse step, the actual temperature of the warm pure water is lower than 75° C. by the emission of a heat caused by the emission of air in the discharge and the heat absorbing action of a substrate.

As a result of the execution of the rinse step, the concentration of a sulfate ion was equal to that in the example 1.

According to the example, therefore, it is possible to reduce the deposition of an ammonium sulfate type foreign matter in the same manner as in the example 1.

EXAMPLE 3

An example 3 is a further example of the execution of the sulfuric acid removing step and FIG. 3 is a view for explaining the example 1. In the example, a mixed solution of sulfuric acid and perwater at 100° C. was used in resist stripping at the steps 5 and 10 and a normal low temperature rinse (a room temperature to 40° C.) was carried out, and warm pure water at 92° C. was used in cleaning before the attachment of a pellicle at the step 12.

As a result, the concentration of the sulfate ion after the cleaning was equal to that in the example 1.

According to the example, therefore, it is possible to reduce the deposition of an ammonium sulfate type foreign matter in the same manner as in the example 1.

EXAMPLE 4

Figure 4A:
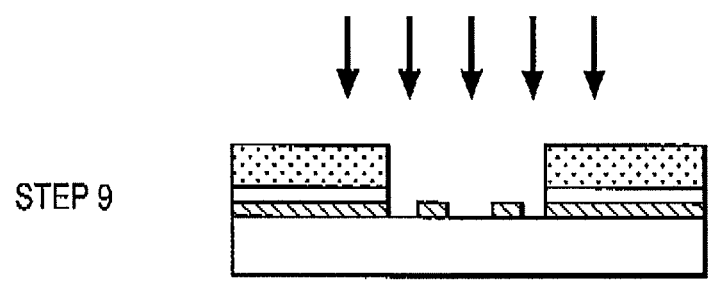
FIGS. 4A and 4B are views for explaining an ammonium ion formation preventing treatment according to an example 4.
Figure 4B:
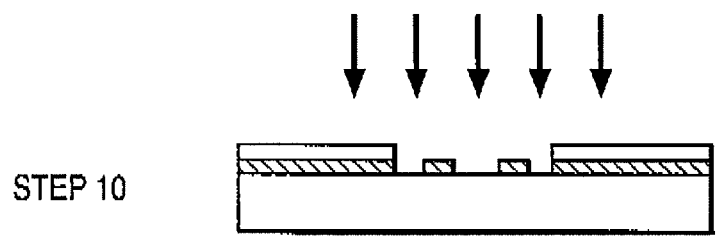

An example 4 is an example of the execution of an ammonium ion formation preventing treatment and FIGS. 4A and 4B are the views for explaining the ammonium ion formation preventing treatment according to the example 4.

In the example, the semitranslucent film exposed at the step 9 in the process described with reference to FIG. 1 was subjected to a heat treatment at approximately 350° C. for approximately 20 minutes in an air atmosphere (FIG. 4A). An arrow in FIGS. 4A and 4B typically indicate a state in which the heat treatment is carried out.

Referring to a surface condition before and after this treatment, an analysis was carried out by an X-ray photoelectron spectral analyzing method. As a result, an O (oxygen) concentration was increased to be 55 atomic %, an N (nitrogen) concentration was decreased to 30 atomic %, and a depth in which a change in a composition was recognized was approximately 15 Å.

Next, a resist was stripped at the step 10 and the concentration of ammonium on the surface of a semitranslucent film was then measured by ion chromatography. As a result, the concentration was 108 ng/cm$^2$ in a sample having no ammonium formation preventing treatment and was 1.3 ng/cm$^2$ in a sample having the ammonium formation preventing treatment.

While the ammonium format ion preventing treatment was carried out in a state in which the resist at the step 9 remains in the example 4, the same advantages were obtained by the execution of the treatment over a semitranslucent film exposed by resist stripping and cleaning at the step 10 (FIG. 4B).

According to the example, it is possible to reduce a substance to be the origin of the depositing reaction of an ammonium sulfate type foreign matter by the irradiation of an exposed light through the execution of the ammonium ion formation preventing treatment. As a result, it is possible to reduce the deposition of the ammonium sulfate type foreign matter.

EXAMPLE 5

Figure 5A:
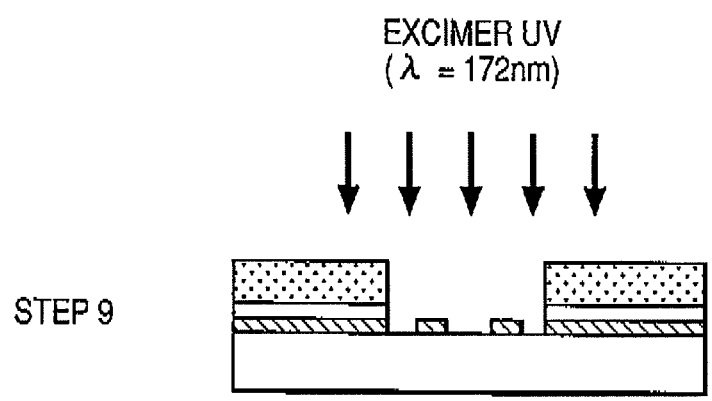
FIGS. 5A and 5B are views for explaining an ammonium ion formation preventing treatment according to an example 5.
Figure 5B:
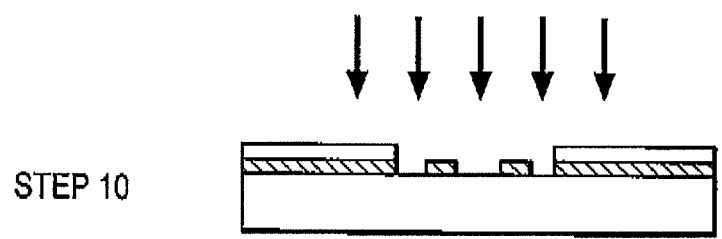

An example 5 is another example of the execution of the ammonium ion formation preventing treatment and FIGS. 5A and 5B are the views for explaining the ammonium ion formation preventing treatment according to the example 5.

In the example 5, a continuous irradiation was executed in the air for approximately 15 minutes by using an excimer UV irradiating device having a wavelength of $\lambda=172$ nm in place of the heat treatment in the example 4 (FIG. 5A). An arrow in FIGS. 4A and 4B typically indicate a state in which a UV irradiation is carried out. A resist was stripped and the concentration of ammonium on the surface of a semitranslucent film was then measured by ion chromatography. As a result, the concentration was 108 ng/cm$^2$ in a sample having no ammonium formation preventing treatment and was 3.7 ng/cm$^2$ in a sample having the ammonium formation preventing treatment. From the result, it can be supposed that a surface reforming layer is formed by this treatment in the same manner as in the example 4.

While the ammonium formation preventing treatment has been carried out in a state in which the resist at the step 9 remains in the example 5, the same advantages were obtained by the execution of the treatment over the semitranslucent film exposed by resist stripping and cleaning at the step 10 (FIG. 5B).

According to the example, therefore, it is possible to reduce the deposition of an ammonium sulfate type foreign matter in the same manner as in the example 4.

EXAMPLE 6

An example 6 is an example in which both the sulfuric acid removing step and the ammonium ion formation preventing treatment are executed.

In the example, the ammonium ion formation preventing treatment was carried out by the execution of the same heat treatment as that in the example 4 at the step 9. Then, the sulfuric acid removing step was carried out by using the same mixed solution 7 of sulfuric acid and perwater at 100° C. as that in the example 1 in the resist stripping at the step 10, and the warm pure water 8 at 92° C. in a subsequent rinse.

According to the example, an ammonium ion can be decreased equivalently to the example 4 by the ammonium ion formation preventing treatment, and furthermore, a cleaning solution resistance and a warm water resistance in a semitranslucent film are increased. Therefore, it is possible to reduce a decrease in the semitranslucent film by the treatment at the step 10, thereby preventing a change in an optical characteristic.

At the sulfuric acid removing step to be carried out at the step 10, furthermore, it is also possible to reduce a sulfate ion in the same manner as in the example 1.

According to the example, it is possible to reduce both of substances to be the origin of the depositing reaction of an ammonium sulfate type foreign matter through the irradiation of an exposed light by executing both the sulfuric acid removing step and the ammonium ion formation preventing treatment. As a result, it is possible to reduce the deposition of the ammonium sulfate type foreign matter.

EXAMPLE 7

An example 7 is another example in which both the sulfuric acid removing step and the ammonium ion formation preventing treatment are executed.

In the example, there was executed a sulfuric acid removing step of removing the ammonium ion formation preventing layer provided at the step 9 in the example 6 through the cleaning before the attachment of a pellicle at the step 12. In the example, the sulfuric acid removing step was carried out to partially remove the ammonium ion formation preventing layer by using warm pure water at 92° C. and a strong alkaline liquid. As a result, it is possible to remove a sulfate ion in a surface layer portion, and furthermore, to suppress the generation of an ammonium ion from a semitranslucent film.

According to the example, it is possible to reduce both of substances to be the origin of the depositing reaction of an ammonium sulfate type foreign matter through the irradiation of an exposed light by executing both the sulfuric acid removing step and the ammonium ion formation preventing treatment. As a result, it is possible to reduce the deposition of the ammonium sulfate type foreign matter.

In the example, the ammonium ion formation preventing layer is reduced by the removal. In order to supplement an ammonium ion formation preventing effect, therefore, an ammonium ion formation preventing process may be carried out again before the attachment of a pellicle by using the same method as that in the example 4, for instance.

The invention is not restricted to the examples described above.

While the description has been given to the halftone type phase shift mask for the ArF excimer laser in the examples, the invention can be applied to a lithographic mask to be used in an exposing device utilizing such high power exposing means as to promote the forming reaction of an ammonium sulfate type foreign matter, for example, a photomask such as another phase shift mask and a radiation mask such as an X ray, EUV or an electron beam.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A method of manufacturing a lithographic mask for 200 nm or lower wavelength of exposure light having a pattern on a surface of a substrate, comprising:
    forming the pattern on the surface, said pattern comprising a layer of a material including nitrogen;
    cleaning the pattern on the surface using a liquid including sulfuric acid, and
    removing the sulfuric acid from the pattern on the surface using a liquid not containing sulfur at a temperature of 85° C. or higher,
    wherein, after said pattern forming, the layer is subject to an ammonium ion prevention treatment, which treatment comprises at least one of heating, light irradiation and oxidation and is carried out in an atmosphere including oxygen, so that a composition of the layer is reformed.

2. The method of claim 1, wherein said sulfuric acid removing is carried out by using a liquid not containing sulfur at a temperature of 90° C. or higher.

3. The method of claim 1, wherein the treatment for the layer is carried out at a final step for manufacturing the lithographic mask but before attachment of a pellicle.

4. The method of claim 3, wherein the treatment for the layer is carried out a plurality of times.

5. The method of claim 1, wherein the treatment for the layer is carried out so that a concentration of ammonium ions measured by ion chromatography through a pure water extraction over the surface subjected to the treatment being 20 ng/cm$^2$ or lower.

6. The method of claim 1, wherein the lithographic mask is a phase shift mask for the exposure of ArF excimer laser, and the layer contains molybdenum, silicon and nitrogen.

7. The method of claim 1, wherein said treatment is carried out before said cleaning.

8. The method of claim 1, wherein said treatment is carried out after said sulfuric acid removing.

9. The method of claim 1, wherein the layer comprises molybdenum, silicon and nitrogen, and said treatment is carried out before said sulfuric acid removing.

10. The method of claim 1, wherein the treatment comprises heating which is carried out at a temperature of 180° C. or higher.

11. The method of claim 1 wherein the treatment comprises light irradiation which is carried out with excimer UV light.

12. The method of claim 1, wherein the treatment comprises two or more of the heating, the light irradiation and the oxidation.

13. The method of claim 1, wherein the treatment comprises light irradiation which is preformed using light having a wavelength of 200 or less with an irradiation output of 30 mW or more.

14. The method of claim 1, wherein the composition of the layer is reformed by increasing the content of oxygen.

15. A method of manufacturing a lithographic mask for 200 nm or lower wavelength of exposure light having a pattern on a surface of a substrate comprising:
    forming the pattern on the surface, said pattern comprises a layer of a material including nitrogen; and
    carrying out an ammonium ion prevention treatment, after said pattern forming, said treatment comprises at least one of heating, light irradiation and oxidation, and is carried out in an atmosphere including oxygen, so that a composition of the layer is reformed.

16. The method of claim 15, wherein the treatment is carried out at a final step for manufacturing the lithographic mask but before attachment of a pellicle.

17. The method of claim 15, wherein the treatment is carried out so that a concentration of ammonium ions measured by ion chromatography through a pure water extraction over the surface subjected to the treatment being 20 ng/cm$^2$ or lower.

18. The method of claim 15, wherein the treatment is carried out a plurality of times.

19. The method of claim 15, wherein the lithographic mask is a phase shift mask for the exposure of ArF excimer laser, and the layer contains molybdenum, silicon and nitrogen.

20. The method of claim 15, wherein after the pattern forming, cleaning the surface using a non-sulfuric acid solution is carried out.

21. The method of claim 15, wherein the treatment comprises heating which is carried out at a temperature of 180° C. or higher.

22. The method of claim 15 wherein the treatment comprises light irradiation which is carried out with excimer UV light.

23. The method of claim 15, wherein the treatment comprises two or more of the heating, the light irradiation and the oxidation.

24. The method of claim 15, wherein treatment comprises the light irradiation which is preformed using light having a wavelength of 200 or less with an irradiation output of the light irradiation is 30 mW or more.

25. The method of claim 15, wherein the composition of the layer is reformed by increasing the content of oxygen.

* * * * *